United States Patent
Liu

(10) Patent No.: US 7,474,882 B2
(45) Date of Patent: Jan. 6, 2009

(54) SYSTEM AND METHOD FOR RF GAIN CONTROL

(75) Inventor: I-Ru Liu, Taipei (TW)

(73) Assignee: Accton Technology Corporation, Hsinchu (TW)

( * ) Notice: Subject to any disclaimer, the term of this patent is extended or adjusted under 35 U.S.C. 154(b) by 361 days.

(21) Appl. No.: 10/721,239

(22) Filed: Nov. 26, 2003

(65) Prior Publication Data

US 2005/0113046 A1    May 26, 2005

(51) Int. Cl.
*H03G 3/20* (2006.01)
(52) U.S. Cl. .................. 455/234.2; 455/226.3; 375/345
(58) Field of Classification Search ... 455/232.1–253.2, 455/226.3; 375/345
See application file for complete search history.

(56) References Cited

U.S. PATENT DOCUMENTS

| | | | | |
|---|---|---|---|---|
| 5,732,341 A | * | 3/1998 | Wheatley, III | ........... 455/234.1 |
| 5,974,083 A | * | 10/1999 | Fujita | .......................... 375/130 |
| 6,873,832 B2 | * | 3/2005 | Shi | ......................... 455/232.1 |
| 2003/0072397 A1 | * | 4/2003 | Kim et al. | .................... 375/347 |
| 2004/0242177 A1 | * | 12/2004 | Yang | ...................... 455/234.1 |
| 2005/0069064 A1 | * | 3/2005 | Propp et al. | ................. 375/350 |

* cited by examiner

*Primary Examiner*—Edward Urban
*Assistant Examiner*—Adeel Haroon
(74) *Attorney, Agent, or Firm*—WPAT. P.C.; Justin King

(57) ABSTRACT

The present invention provides a system and method for RF gain control that extracts the background noise information of the received RF signal in the short inter-frame space (SIFS), and computes the background noise information and strength information of the received RF signal to output a feedback control signal to adjust the gain of the RF signal receiver. It optimizes the receiving system and makes the received RF signal be of sufficient strength and have a good quality as well.

4 Claims, 4 Drawing Sheets

SYSTEM AND METHOD FOR RF GAIN CONTROL

BACKGROUND OF THE INVENTION (a). Field of the Invention

The present invention relates in general to the field of gain control, and more particularly to a system and method that adjusts the gain value according the signal strength and background noise informations retrieved from received radio frequency (RF) signals, thereby optimizing received RF signal quality.

(b). Description of the Prior Arts

In the Internet era, people tend to consume a lot of information rapidly. Personal mobile products, such as cellular phones and personal digital assistants (PDA), encourage this trend and are popularized to daily life with the progress of wireless communication technologies.

The personal mobile products achieve the goal of making communications any time and any place by means of the wireless communication technologies, which abandon wire connections used by wire communication. FIG. 1 is a block diagram showing a conventional wireless communication architecture, which includes a receiving unit 1, a processing unit 2, a transmitting unit 3, and an antenna 4. The receiving unit 1 receives a wireless signal 10 via the antenna 4. The processing unit 2, coupled to the receiving unit 1, processes the wireless signal 10 in a proper manner, such as high frequency noise elimination, quantization, etc., to transfer into the user data formats. On the other hand, the processing unit 2 receives signals in the user data formats and transfers them into a proper format suitable for the transmitting unit 3. The transmitting unit 3 amplifies the signals from the processing unit 2, and transmits them out via the antenna 4.

However, the quality of the wireless communication is deeply subject to many distortion elements in the surrounding environment, such as space attenuation, loss, reflection, rotation, added noise, interference, etc., thus the receiving unit 1 adjusts its gain value according to the signal strength of received signals, thereby maintaining the received signal quality. Here the gain value is the ratio of the output power to the input power of the receiving unit 1, and it implies the signal amplification ability of the receiving unit 1. However, when the received signals are amplified by the receiving unit 1, background noises are also amplified. Accordingly, it is hard to improve the received signal quality during the signal amplification, and this is very disadvantageous for the subsequent signal demodulation and identification. Therefore, what is needed is a system and method for RF gain control that can keep the noises in a low and constant level and thus improve the received signal quality.

SUMMARY OF THE INVENTION

An object of the present invention is to provide a system for RF gain control. The system includes a receiver for receiving a RF signal, and a signal-sampling device, coupled to the receiver, for retrieving a signal strength information from the RF signal. The system also includes a noise-sampling device, coupled to the receiver, for retrieving a noise information from the RF signal, and an operation unit coupled to the receiver, the signal-sampling device and the noise-sampling device. The operation unit generates a feedback control signal according to the signal strength and noise informations, and provides the feedback control signal to the receiver to adjust a gain value thereof.

Another object of the present invention is to provide a method for RF gain control. The method includes: receiving a RF signal; retrieving a signal strength information from the RF signal; retrieving a noise information from the RF signal; and adjusting a gain value according to the signal strength and noise informations.

DETAILED DESCRIPTION OF THE PRESENT INVENTION

This section will explain the present invention in detail with preferred embodiments and appended drawings. The preferred embodiments are suitable for use in the case of wireless local area network (WLAN).

In WLAN, a data-carrying signal can be considered as composed of frames one after another. The time interval between two frames is known as a short inter-frame space (SIFS). There are no data-carrying signals in this time interval, thus the signals received during the interval are the so-called background noises. The technological feature of the present invention is then to detect the SIFS in a received signal and to retrieve therein the background noises of a communication environment, thereby enabling a signal receiver to control the noises under a specific level while adjusting its gain value.

Figure 1:
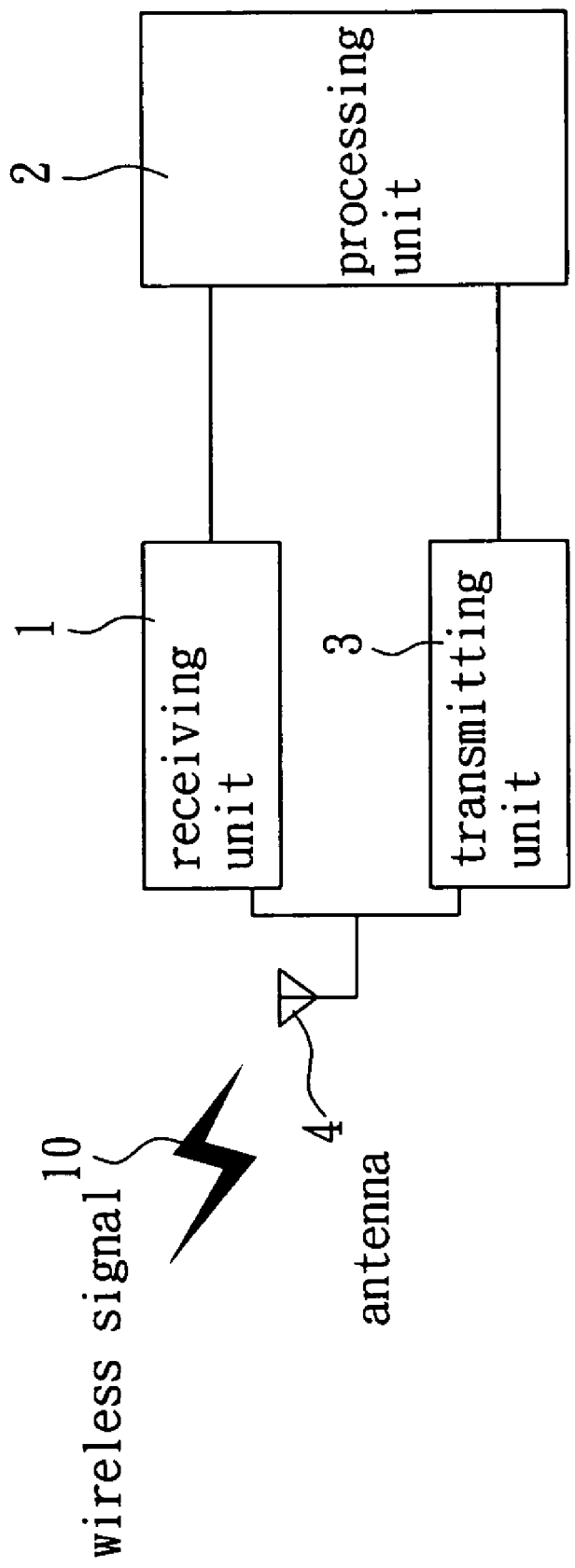
FIG. 1 is a block diagram showing a conventional wireless communication architecture.
Figure 2:
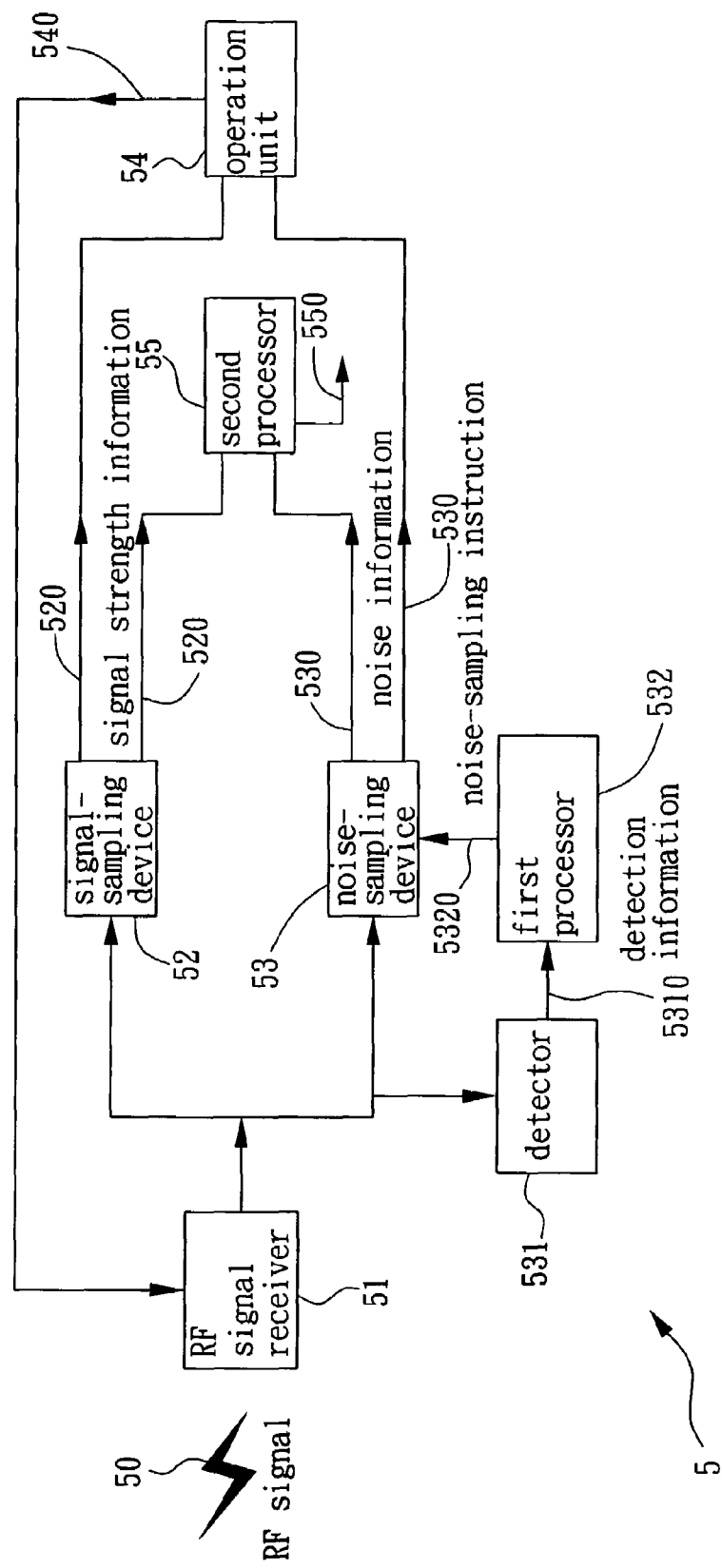
FIG. 2 is a block diagram showing a preferred embodiment of the system 5 for RF gain control according to the present invention.

FIG. 2 is a block diagram showing a preferred embodiment of the system 5 for gain control according to the present invention. As shown in FIG. 2, the system 5 includes a RF signal receiver 51, a signal-sampling device 52, and a noise-sampling device 53. The RF signal receiver 51 is used to receive a RF signal 50. Then, the RF signal 50 is provided to the signal-sampling device 52 and the noise-sampling device 53 to retrieve a signal strength information 520 and a noise information 530 respectively.

The system 5 further includes a detector 531 and a first processor 532 for facilitating the detection of the SIFS and the retrieval of the noise information 530. The detector 531, coupled to the RF signal receiver 51, detects a time interval between two contiguous frames in the RF signal 50 to generate a detection information 5310. The detected time interval corresponds to a SIFS, that is, the detection information 5310 indicates the timing position of the SIFS in the RF signal 50. The frames detected by the detector 531 may include a request to send (RTS) frame, a clear to send (CTS) frame, an acknowledgement (ACK) frame, a data frame, a beacon frame, a poll frame, a data plus poll frame, a data plus ACK frame, or a data plus ACK plus poll frame.

The first processor 532 is coupled to the detector 531 and the noise-sampling device 53, and generates a noise-sampling instruction 5320 according to the detection information 5310. The noise-sampling instruction 5320 directs the noise-sampling device 53 to retrieve the noise information 530 from the RF signal 50. An example of the noise-sampling instruction 5320 is a noise gate, which is a digital control signal, and for the noise-sampling device 53, a logic 0 of the noise gate means not to sample while a logic 1 means to sample.

However, the noise-sampling device 53 is disabled in several particular situations. If the RF signal receiver 51 is in a state of not receiving data, the first processor 532 inhibits the noise-sampling instruction 5320 to disable the noise-sampling device 53. That is, the noise-sampling device 53 does not sample the noises during the state of not receiving. An example of this state is a Receive-to-Transmit Turnaround Mode, which means that the receiver 51 stops to receive any new signal while still operating on the previous data. Alternatively, the first processor 532 may disable the noise-sampling device 53 by suspending to generate the noise-sampling instruction 5320 during the state of not receiving.

Another situation to disable the noise-sampling device 53 is that the first processor 532 is further coupled to a transmitter (not shown in FIG. 2), and also the transmitter is in a state of transmitting data. Similarly, the first processor 532 can disable the noise-sampling device 53 by inhibiting the noise-sampling instruction 5320, or by simply not generating the noise-sampling instruction 5320 during the data transmission.

The system 5 also includes an operation unit 54, which is coupled to the RF signal receiver 51, the signal-sampling device 52, and the noise-sampling device 53. The operation unit 54 receives the signal strength information 520 and the noise information 530, and performs a predetermined operation on the informations to generate a feedback control signal 540. Then, the operation unit 54 provides the feedback control signal 540 to the RF signal receiver 51 to adjust a gain value thereof. It is notable that the present invention takes into consideration the weight occupied by the noises in the RF signal 50 along with the strength of the RF signal 50. That is, the noise interference is estimated, and the gain value of the RF signal receiver 51 is accordingly adjusted to optimize the received RF signal quality.

Figure 3:
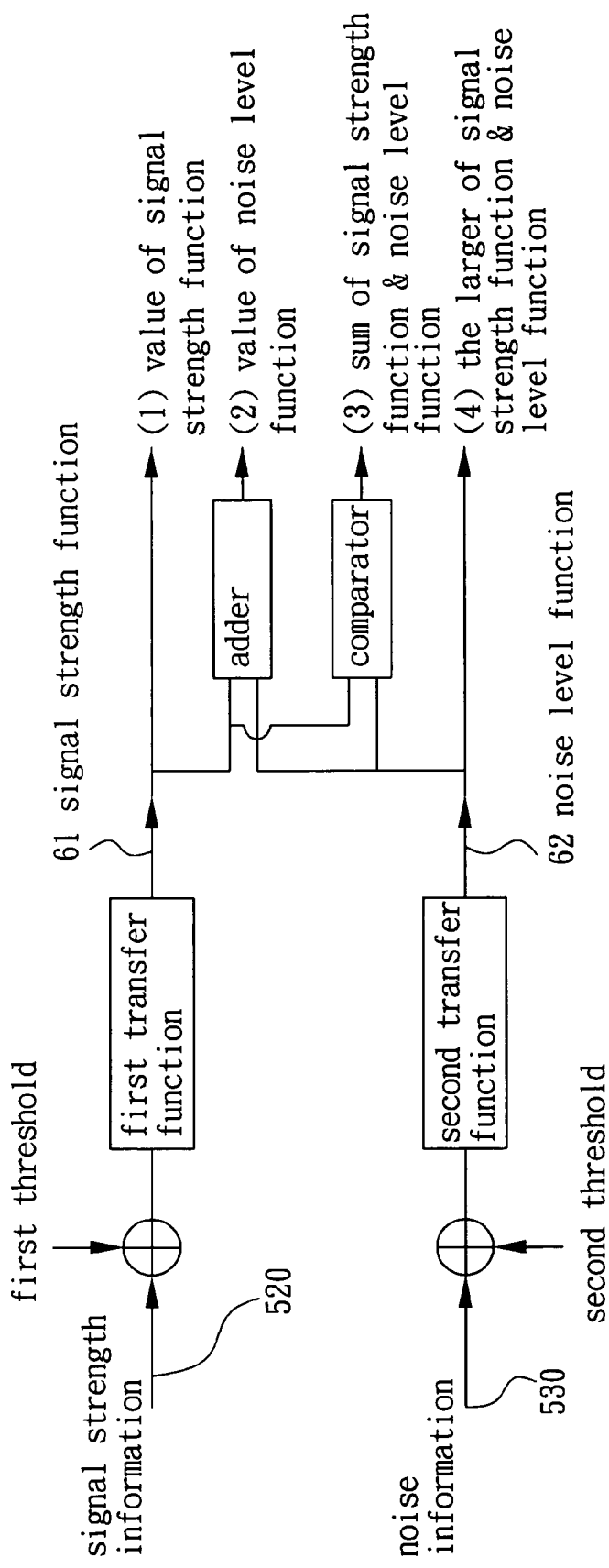
FIG. 3 is a block diagram showing a preferred embodiment of the operation unit of FIG. 2 according to the present invention.

FIG. 3 is a block diagram showing a preferred embodiment of the operation unit 54 according to the present invention. In FIG. 3, the signal strength information 520 and the noise information 530 are first subtracted by a first and a second predetermined thresholds respectively, and then multiplied by a first and a second predetermined transfer functions to generate a signal strength function 61 and a noise level function 62 respectively. Finally, four operation values are obtained by an adder and a comparator: (1) the value of the signal strength function 61; (2) the value of the noise level function 62; (3) the sum of the signal strength function 61 and the noise level function 62; and (4) the larger of the signal strength function 61 and the noise level function 62. The operation unit 54 may select one of the four operation values to output as the feedback control signal 540 according to a predetermined algorithm. If the algorithm determines that the function of noise gain control is disabled, then value (1) is selected for output; if the function of signal gain control is disabled for maintaining a constant noise level, then value (2) is selected; if both the functions of signal and noise gain control are enabled, no matter there is any received signal, then value (3) is selected; and if the function of signal/noise gain control is enabled in the case of receiving any/no signal, then value (4) is selected.

The predetermined thresholds and transfer functions mentioned above have impacts on the sensibility and magnitude of gain control. In the embodiment of FIG. 3, the second threshold for the noise information 530 is selected to be lower than the first threshold for the signal strength information 520, while the amplification and time constant of the second transfer function for the noise information 530 are set to be larger than those of the first transfer function for the signal strength information 520.

Please refer to FIG. 2 again. The system 5 for RF gain control further includes a second processor 55, which is coupled to the signal-sampling device 52 and the noise-sampling device 53. The second processor 55 generates a signal quality information 550 according to the signal strength information 520 and the noise information 530, thereby estimating the performance of the receiver 51. The signal quality information 550 may be a signal-to-noise ratio (SNR), which is obtained from dividing the signal strength information 520 by the noise information 530.

Figure 4:
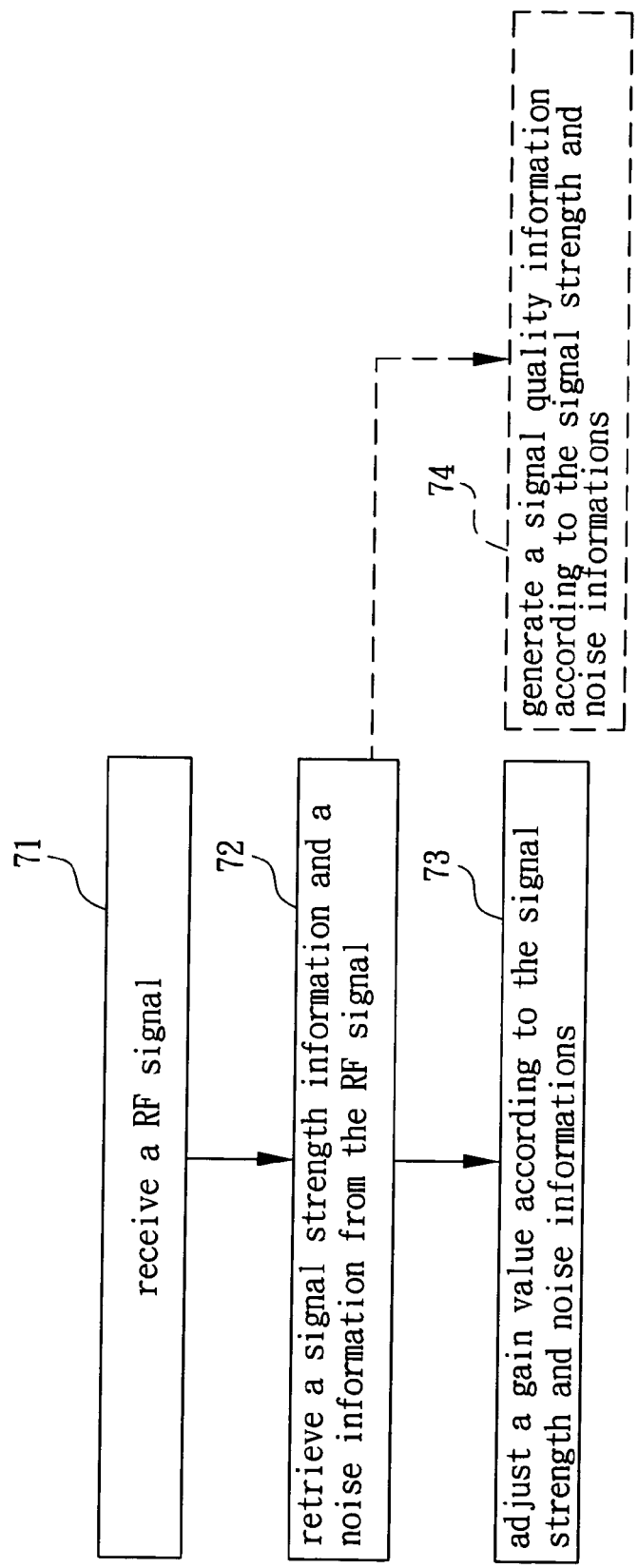
FIG. 4 is a flow chart showing a preferred embodiment of the method for RF gain control according to the present invention.

FIG. 4 is a flow chart showing a preferred embodiment of the method for RF gain control according to the present invention. As shown in FIG. 4, the flow chart includes steps of:

71 receiving a RF signal;
72 retrieving a signal strength information and a noise information from the RF signal; and
73 adjusting a gain value according to the signal strength and noise informations.

Moreover, the flow of FIG. 4 further includes a step 74, which generates a signal quality information according to the signal strength and noise informations obtained in the step 72. An example of the signal quality information is a signal-to-noise ratio (SNR). The signal quality information can help to determine a proper gain value, or to make a request to the transmitting side for improving signal quality thereof.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A system for RF gain control comprising:
   a receiver for receiving a RF signal;
   a signal-sampling device, coupled to the receiver, for retrieving a signal strength information from the RF signal;
   a noise-sampling device, coupled to the receiver, for retrieving a noise information from the RF signal; and
   an operation unit, coupled to the receiver, the signal-sampling device and the noise-sampling device, for generating a feedback control signal according to the signal strength and noise information, wherein the operation unit provides the feedback control signal to the receiver to adjust a gain value thereof;
   a detector, coupled to the receiver, for detecting a time interval between two contiguous frames in the RF signal and for generating a detection information; and
   a first processor, coupled to the detector and the noise-sampling device, for generating a noise-sampling instruction according t the detection information to retrieve the noise information from the RF signal;
   wherein the feedback control signal is selected from a group consisting of a value of the signal strength function, a value of the noise level function, a sum of the signal strength function and the noise level function, and a larger of the signal strength function and the noise level function; and
   wherein the value of the signal strength function, the value of the noise level function, the sum of the signal strength function and the noise level function, and the larger of the signal strength function and the noise level function are obtained from a predetermined algorithm that the signal strength information and the noise information are subtracted by a first and a second predetermined thresholds respectively, and then multiplied by a first and second predetermined transfer functions to generate the signal strength function and the noise level function respectively.

2. A system for RF gain control comprising:

a receiver for receiving a RF signal;

a signal-sampling device, coupled to the receiver, for retrieving a signal strength information from the RF signal;

a noise-sampling device, coupled to the receiver, for retrieving a noise information from the RF signal;

an operating unit, coupled to the receiver, the signal-sampling device and the noise-sampling device, for generating a feedback control signal according to the signal strength and noise information, wherein the operation unit provides the feedback control signal to the receiver to adjust a gain value thereof, wherein the feedback control signal is obtained by that the signal strength information and the noise information are subtracted by a first and a second predetermined thresholds respectively, and then multiplied by a first and a second predetermined transfer functions to generate a signal strength function and a noise level function respectively to output the feedback control signal according to a predetermined algorithm;

a detector, coupled to the receiver, for detecting a time interval between two contiguous frames in RF signal and for generating a detection information; and a first processor, coupled to the detector and the noise-sampling device, for generating a noise-sampling instruction according to the detection information to retrieve the noise information from the RF signal.

3. A system for RF gain control comprising:

a receiver for receiving a RF signal;

a signal-sampling device, coupled to the receiver, for retrieving a signal strength information from the RF signal;

an operating unit, coupled to the receiver, the signal-sampling device and the noise-sampling device, for generating a feedback control signal according to the signal strength and noise information, wherein the operation unit provides the feedback control signal to the receiver to adjust a gain value thereof, wherein the feedback control signal is obtained by that the signal strength information and the noise information are subtracted by a first and a second predetermined thresholds respectively, and then multiplied by a first and a second predetermined transfer functions to generate a signal strength function and a noise level function respectively to output the feedback control signal according to a predetermined algorithm.

4. A method for gain in a receiver comprising:

receiving a RF signal;

retrieving a signal strength information from the RF signal;

retrieving a noise information from the RF signal; and adjusting a gain value according to the signal strength and noise informations, wherein the noise information is retrieved from a short inter-frame space in the RF signal, wherein the gain value is adjusted by a feedback control signal which is obtained by that the signal strength information and the noise information are subtracted by a first and a second predetermined thresholds respectively, and then multiplied by a first and a second predetermined transfer functions to generate a signal strength function and a noise level function respectively to output the feedback control signal according to a predetermined algorithm.

* * * * *